United States Patent
Gebhardt et al.

(10) Patent No.: US 7,026,816 B2
(45) Date of Patent: Apr. 11, 2006

(54) GRADIENT COIL/RF ANTENNA UNIT AND MAGNETIC RESONANCE APPARATUS EMPLOYING SAME

(75) Inventors: Matthias Gebhardt, München (DE); Wolfgang Renz, Erlangen (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/993,318

(22) Filed: Nov. 19, 2004

(65) Prior Publication Data

US 2005/0162166 A1    Jul. 28, 2005

(30) Foreign Application Priority Data

Nov. 20, 2003 (DE) .................... 103 54 228

(51) Int. Cl.
  *G01V 3/00* (2006.01)
(52) U.S. Cl. .................. 324/318; 600/421
(58) Field of Classification Search ............ 324/318, 324/319, 320, 322; 600/421, 410
See application file for complete search history.

(56) References Cited

U.S. PATENT DOCUMENTS

| | | | | |
|---|---|---|---|---|
| 5,036,282 A | * | 7/1991 | Morich et al. | 324/318 |
| 5,311,134 A | * | 5/1994 | Yamagata et al. | 324/318 |
| 5,864,235 A | * | 1/1999 | Moritz et al. | 324/318 |
| 6,433,550 B1 | | 8/2002 | Kinanen | |

FOREIGN PATENT DOCUMENTS

| | | |
|---|---|---|
| DE | OS 40 37 894 | 6/1991 |
| DE | OS 42 32 884 | 3/1994 |
| DE | PS 44 22 781 | 2/1996 |
| DE | OS 101 24 737 | 12/2002 |

* cited by examiner

*Primary Examiner*—Louis Arana
(74) *Attorney, Agent, or Firm*—Schiff Hardin LLP

(57) ABSTRACT

A gradient coil radio-frequency antenna unit for a magnetic resonance apparatus has a radio-frequency antenna and a plate-shaped gradient coil unit to generate a gradient magnetic field in an examination region of the magnetic resonance apparatus. The gradient coil unit is surrounded by a conductor of the radio-frequency antenna. The windings of the gradient coil unit thus lie completely within the conductor of the RF antenna.

21 Claims, 2 Drawing Sheets

GRADIENT COIL/RF ANTENNA UNIT AND MAGNETIC RESONANCE APPARATUS EMPLOYING SAME

BACKGROUND OF THE INVENTION

1. Field of the Invention

The present invention concerns a gradient coil/radio-frequency antenna unit for a magnetic resonance apparatus of the type having a radio-frequency (RF) antenna and a gradient coil unit to generate a gradient magnetic field in an examination region of the magnetic resonance apparatus. The invention furthermore concerns a magnetic resonance apparatus with such a unit.

2. Description of the Prior Art

Magnetic resonance technology is a known modality to, among other things, acquire images of the inside of a body of an examination subject. In a magnetic resonance apparatus (MR apparatus), rapidly switched magnetic gradient fields that are generated by gradient coils are superimposed on a static base magnetic field $B0$ that is generated by a basic field magnet. To trigger magnetic resonance signals, the magnetic resonance apparatus also has a radio-frequency antenna that radiates RF signals, known as the $B1$ field, into the examination subject. The triggered magnetic resonance signals can be acquired with this antenna or further local antennas and processed into magnetic resonance images.

For example, U.S. Pat. No. 6,433,550 discloses an open magnetic resonance apparatus with a C-shaped basic field magnet that has For example, U.S. Pat. No. 6,433,550 discloses an open magnetic resonance apparatus with a C-shaped basic field magnet that has one pole plate at each of the two ends of the C-structure on both sides of a patient acceptance chamber arranged in the opening of the C-structure, between which the basic magnetic field of the magnetic resonance apparatus can be generated, at least within the patient acceptance chamber. Essentially planar parts of a gradient coil system, and likewise planar parts of an antenna system of the magnetic resonance apparatus connected to the gradient coil system, are also arranged at each of the pole plates facing the patient acceptance chamber. Gradient coils for the aforementioned gradient coil system are described in German OS 40 37 894 and German OS 44 22 781.

An antenna arrangement for a magnetic resonance apparatus in which a basic magnetic field is established between two pole plates is also known from German OS 42 32 884. A sub-antenna into which a radio-frequency current is fed is arranged at each pole plate. The sub-antennas are formed by a sealed, grounded shield facing the pole plate and a laminar conductor structure disposed at a distance from the shield and essentially parallel thereto.

Furthermore, from German OS 42 32 884 the desirability of keeping the pole plate separation optimally small so that the weight of the basic field magnets remains low and a better basic magnet field homogeneity is achieved. For this reason it is advantageous to keep all internal components between the pole flanges (such as the gradient coil system, the radio-frequency shield and the antenna arrangement) as flat as possible. This competes with the fact that an optimally large separation of the antenna arrangement from the radio-frequency shield is advantageous for a high degree of efficiency of the antenna arrangement. This is particularly true given the use of the antenna arrangement to receive magnetic resonance signals.

A circular, planar radio-frequency antenna for open magnetic resonance apparatuses is known from German OS 101 24 737. It has two separated systems made from planar conductors for currents arranged on a carrier plate. To tune to the desired resonance frequency, the conductors are capacitively shorted at least at one end by tuning capacitors connected to ground. Only one planar metal layer into which currents offset by 90°, are fed is arranged on each carrier plate. Tuning capacitors are arranged at the infeed location and the opposite side.

Since in general in magnetic resonance systems the space within the homogenous basic magnetic field $B0$ is costly and therefore scarce, every attempt to minimally occupy the available space by integration or maximum use of the available space for the patient is advantageous.

SUMMARY OF THE INVENTION

It is an object of the invention to specify a gradient coil/radio-frequency antenna unit and a magnetic resonance apparatus with such a unit that exhibits an optimally compact design, i.e. in particular a low overall height, with a higher efficiency.

The above object is achieved by gradient coil/radio-frequency antenna unit of the type initially described wherein the gradient coil unit is surrounded by a conductor of the radio-frequency antenna. The windings of the gradient coil unit thus lie completely within a conductor of the RF antenna. The enclosing conductors then no longer form a thin layer but rather form a plate with the thickness of the gradient coil unit, with the surface of the plate being formed by the conductors. This has the advantage that the space requirement for the overall height of the combination of gradient coil unit and radio-frequency antenna is distinctly reduced compared to conventional solutions. Because the gradient coil unit is completely enclosed, it is not impaired with regard to its structure, in particular by the type of the windings.

Due to the compact structure, in a first case with an unmodified patient acceptance chamber of a magnetic resonance apparatus, its basic field magnet can be dimensioned smaller and is therewith significantly more economical. In a second case, given an unmodified basic field magnet, a larger patient acceptance chamber is achieved that, among other things, increases the patient comfort.

The above object also is achieved by a magnetic resonance apparatus embodying such a gradient coil/radio-frequency antenna unit.

In an embodiment of the gradient coil RF antenna unit, the RF antenna has a return-current conductor that is connected in terms of radio-frequency with the surrounding conductor in the edge region of the gradient coil unit, in particular via at least one capacitor. Due to the attraction of currents flowing in opposite directions, a radio-frequency signal in the surrounding conductor preferably flows in the surface of the surrounding conductor facing towards the back-current conductor.

In another embodiment, the gradient coil unit is fashioned as a circular plate and the return-current conductor has a region substantially parallel to the surrounding conductor. An RF field back flow chamber that allows a closure of the $B1$ magnetic field lines of the radio-frequency signals is then located between the return conductor and the surrounding conductor.

In another embodiment of the gradient coil RF antenna unit, a further electrically conductive connection exists between the return-current conductor and the surrounding conductor. This can be arranged, for example, at a symmetry point of the gradient coil unit, in particular in the center of a circular, plate-shaped gradient coil unit. It is particularly advantageous when the connection is arranged between areas which (without electrical connection) exhibit an essentially equal potential. This has the advantage that no interferences or only minor interferences affect the RF antenna. In the above case a circular gradient coil unit, essentially a zero potential exists in the center of the plate given a suitable configuration of the RF antenna resonator. It is advantageous to fashion the connection so as to be tube-shaped for the acceptance of current and cooling lines of the first gradient coil unit. The current and cooling lines are then preferably located inside the tube, which then serves as a radio-frequency shield for the supply lines. The tube can have an arbitrary cross-section.

For stabilization of the structure of the gradient coil RF antenna unit, the radio-frequency field flow chamber can be at least partially filled with sealing compound. The sealing compound, for example epoxy resin, is selected such that an influence on magnetic fields is not affected. Foam parts can be alternatively or additionally embedded.

In another embodiment of the gradient coil RF antenna unit, the first gradient coil has two primary surfaces and an edge surface and the return conductor has one region that is disposed substantially in a plane of one of the primary surfaces of the first gradient coil unit at a separation from the lateral surface, with the radio-frequency connection between the region being produced with the surrounding conductor.

In a further embodiment, the gradient coil RF antenna unit additionally has a second gradient coil unit that is disposed substantially parallel to the first gradient coil unit and is fashioned for shielding against gradient magnetic fields outside of the examination region.

The radio-frequency shielding of the first gradient coil unit preferably ensues by means of the surrounding conductor and that of the second gradient coil unit preferably ensues via the return-current conductor. The grounding of this RF shield so formed ensues, for example, together with the infeed of the RF signal.

In an embodiment to suppress eddy currents in the surrounding conductor and/or the return-current conductor, these are fashioned multilayer and/or slotted.

DESCRIPTION OF THE PREFERRED EMBODIMENTS

Figure 1:
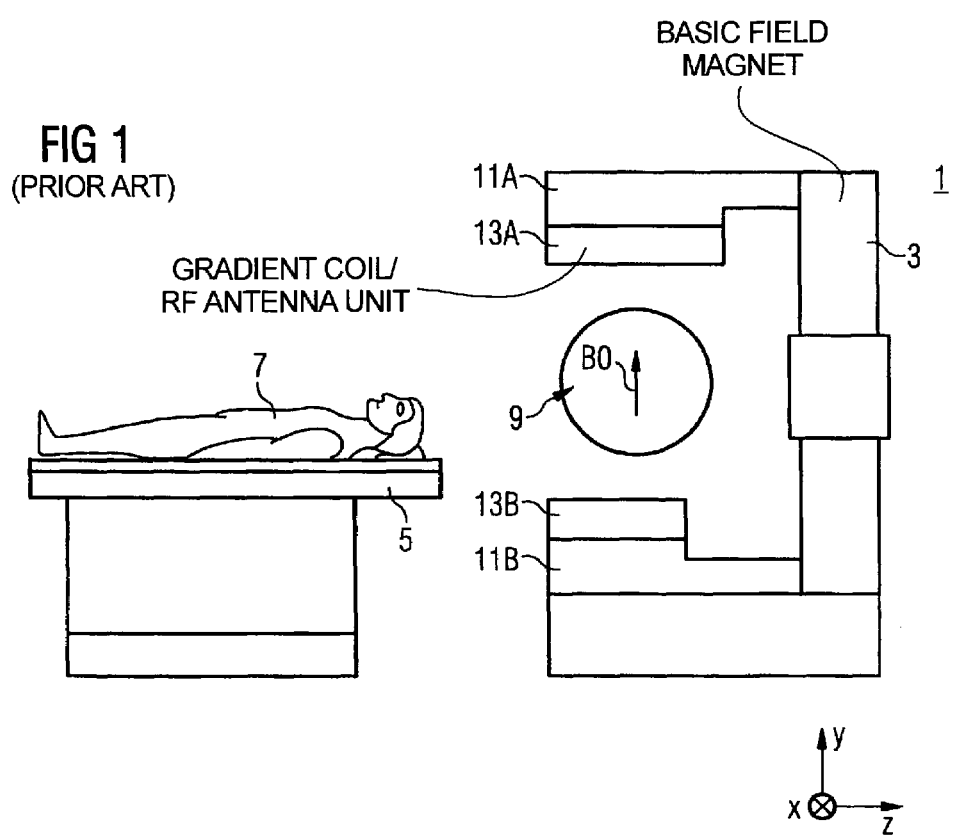
FIG. 1 schematically illustrates a conventional magnetic resonance apparatus with a C-shaped basic field magnet and two gradient coil RF antenna units.

FIG. 1 schematically shows a magnetic resonance apparatus 1 with a C-shaped basic field magnet 3. A patient bed 5 allows a patient 7 to be introduced into the examination region 9. A temporally constant B0 field corresponding to the specified coordinate system is generated in the Y-direction by the basic field magnet 3. Two gradient coil RF antenna units 13A, 13B adapted to the pole plates 11A, 11B of the basic field magnet 3 generate gradient fields in the examination region 9 as well as generating B1 radio-frequency fields in the examination region 9 that are aligned perpendicularly to the basic magnetic field B0.

The pole plates 11A, 11B, and therewith the gradient coil RF antenna units 13A, 13B exhibit a diameter in the range of, for example, 50 cm, 80 cm, 100 cm or larger.

Figure 2:
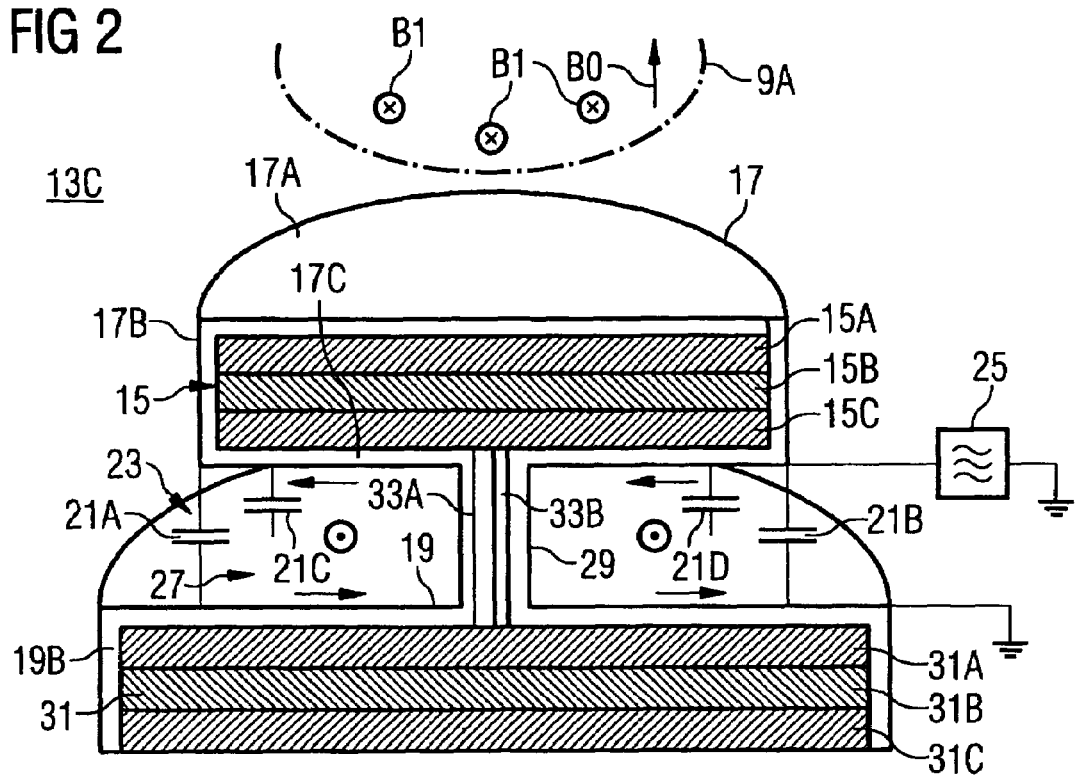
FIG. 2 illustrates one half of an inventive gradient coil radio-frequency antenna unit with a primary gradient coil unit and a secondary gradient coil unit.

An approximately central longitudinal section through a perspectively represented gradient coil RF antenna unit 13C is shown in FIG. 2 as an exemplary embodiment of the invention. The gradient coil RF antenna unit 13C has a primary gradient coil 15 that is fashioned to generate gradient fields in the examination region 9. The gradient coil windings 15A, 15B, 15C for the three spatial axes are schematically shown. The thickness of the primary gradient coil unit 15 is in the range of 2 cm. The primary gradient coil unit in the shape of a circular plate is as a whole surrounded by a surrounding conductor 17.

The surrounding conductor 17, together with a return-current conductor 19 and a series of circularly arranged capacitors 21A, 21B . . . , forms the RF antenna 23. For example, eight or sixteen capacitors 21A, 21B . . . are used. The capacitors 21A, 21B . . . are representative electrical components or units that, for example, are arranged on resonator boards, and adjust the antenna resonator to the resonance frequency or enable it to be detuned (detuning circuit) and/or enable an infeed of RF signals.

For example, a radio-frequency signal from a radio-frequency source 25 is fed to the capacitor 21B. For example, a voltage curve that falls from +U on the supplying capacitor 21B to −U on the opposite capacitor 21A then develops on the surrounding conductor in the resonator of the RF antenna 23. The voltage curve on the return-current conductor 19 proceeds from +U at the capacitor 21A to −U on the capacitor 21B. This affects a current (schematically indicated with arrows) along the surrounding conductor 17 and the return-current conductor 19, i.e. in the antenna resonator. Due to the geometric relation of the currents, they flow in directions opposite to one another in the surrounding conductor 17 and the return-current conductor 19, such that the currents attract and the current in the surrounding conductor essentially flows to the bottom side 17c of the surrounding primary gradient coil unit 15. The separation of the currents of approximately 2–3 cm leads to a non-disappearing radio-frequency magnetic field B1 in the examination region 9A, whereby the magnetic field lines close via the radio-frequency field chamber 27.

The primary gradient coil unit 15 can exhibit an arbitrary shape. The effectiveness of a plate-shaped, circular, planar radio-frequency antenna system is described in detail in the previously mentioned German OS 101 24 737. The configuration of the primary gradient coil unit 15 as a circular plate, as shown in FIG. 2, has the advantage that this is ideally adapted to the region of the most homogenous B0 field curve. The surrounding conductor 17 is also correspondingly designed with two circular side plates 17A, 17C and a narrow side ring 17B. To suppress eddy currents, the surrounding conductor 17 can be fashioned slotted or multilayer, as is typical in RF shields.

In addition to being connected to the capacitors 21A, 21B . . . , the surrounding conductor 17 is connected with the return-current conductor 19 via a tube-shaped conduit 29. The return-current conductor 19 partially encloses a secondary coil 31 that likewise has three windings 31A, 31B, 31C for the three spatial axes and effects a compensation of the magnetic fields of the primary gradient coil 15 for all three spatial axes outside of the examination region 9. The return-current conductor 19 is extended over the entire surface facing toward the examination region 9A for radio-frequency shielding of the secondary gradient coil 31. In FIG.

2 it proceeds over this to the narrow side of the secondary gradient coil 31 as a side ring 19B.

The tube-shaped conductor 29 forms a strut that is arranged in the plate center of the gradient coils 15, 31. Due to this symmetrical arrangement, upon excitation of a circularly polarized B1 radio-frequency field by, for example, coupling of RF signals in two orthogonal directions, the strut connects the primary and secondary gradient coils 15, 31 between two regions of the RF antenna 23 that essentially exhibit a zero potential. Thus no or virtually no interfering currents flow in the strut.

The radius of the circular secondary coil 31 preferably is somewhat larger than the radius of the primary coil 17, so that magnetic field lines can also then still close in the specified manner when further components of the magnetic resonance apparatus are arranged directly in contact with the gradient coil units 15, 31.

The current supply lines and cooling lines 33A, 33B for the primary gradient coil 15 proceeds through the tube-shaped connection 29. The electrical supply of the gradient coil unit 15 can be shielded and thus without interfering influence on the magnetic fields B0, B1 in this manner. The surrounding conductor 17 and the return-current conductor 19 and the tube-shaped connection 29 thus form the radio-frequency shield of the gradient coil RF antenna unit 13C. The thickness of the conductor acting as the radio-frequency shield is, for example, in the range of 15 µm.

Figure 3:
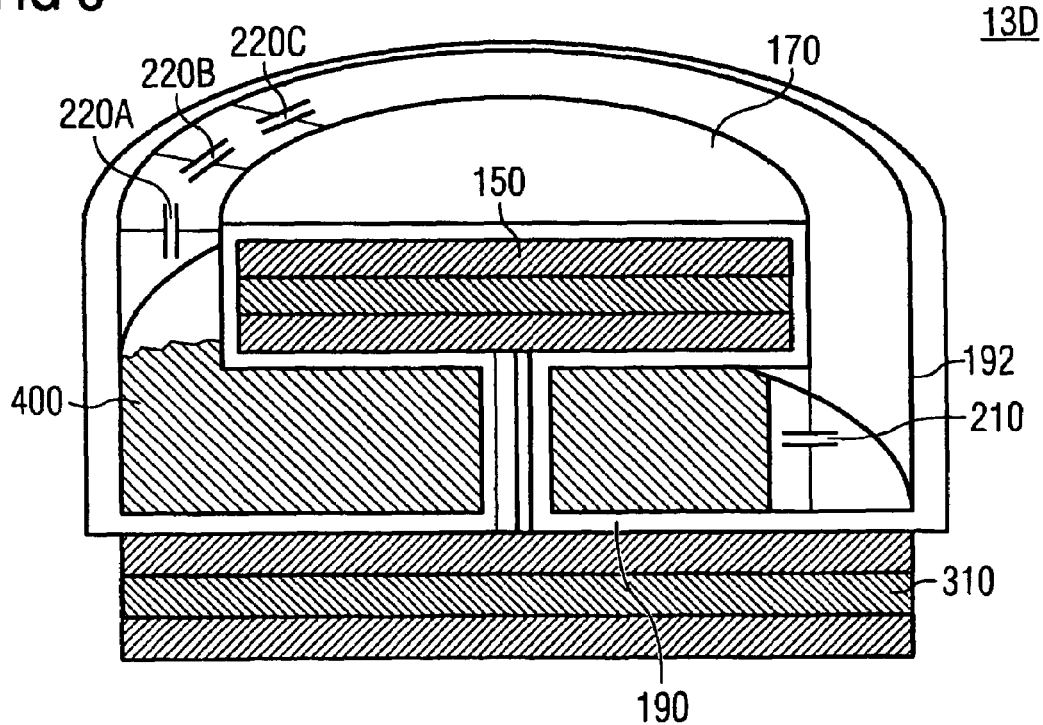
FIG. 3 shows a further embodiment of the gradient coil radio-frequency antenna unit of FIG. 2.

As a further embodiment of the invention, FIG. 3 shows the gradient coil RF antenna unit 13D in a form that reduces a disadvantageous coupling of the RF fields with adjacently arranged components of the MR apparatus.

In addition to this, the return-current conductor 190 is shaped such that it exhibits a region 192 that is arranged in the plane of a primary gradient coil unit 150 and with a separation from this. The closure of an RF resonator path is possible via capacitors 210 that (similar to FIG. 2) can be arranged like spokes on resonator boards between the return-current conductor 190 and a surrounding conductor 170. As an alternative, the closure can ensue with capacitors 220A, 220B, 220C that, for example, also can be arranged annularly. The capacitors 220A, ... proceed from the narrow end of the surrounding conductor 170 to the region 192 of the return-current conductor 190 and thus enable a maximized effective current path in the resonator of the RF antenna.

Furthermore, it is indicated in FIG. 3 that, for the stability of the system, a sealing compound partially or completely fills the field flow chamber between the conductor 170 surrounding the primary gradient coil 150 and the return-current conductor 190 lying on the secondary coil unit 310.

The embodiments shown in FIGS. 2 and 3 are particularly advantageous for use in an open MR apparatus as is shown in FIG. 1.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil/radio-frequency antenna system for a magnetic resonance apparatus, comprising:

two spaced gradient coil/radio-frequency antenna units adapted to be respectively disposed on opposite sides of an open examination volume of a magnetic resonance apparatus;

each of said gradient coil/radio-frequency antenna units comprising a radio-frequency antenna comprising a radio-frequency antenna conductor, said radio-frequency antenna generating a radio-frequency field in said examination volume;

each of said gradient coil/radio-frequency antenna units further comprising a gradient coil unit for generating a gradient magnetic field in said examination volume; and said radio-frequency antenna conductor in each of said gradient coil/radio-frequency antenna units surrounding said gradient coil unit therein, with said radio-frequency antenna conductor between said gradient coil unit and said examination volume.

2. A gradient coil/radio-frequency antenna system as claimed in claim 1 wherein said gradient coil unit is plate-shaped.

3. A gradient coil/radio-frequency antenna system as claimed in claim 2 wherein said gradient coil unit is circular.

4. A gradient coil/radio-frequency antenna system as claimed in claim 2 wherein said radio-frequency antenna conductor that surrounds said gradient coil unit and is between said gradient coil unit and said examination volume is a surrounding conductor, and wherein said radio-frequency antenna in each gradient coil radio-frequency antenna unit additionally comprises a return-current conductor in radio-frequency electrical connection with said surrounding conductor at an edge region of said gradient coil unit.

5. A gradient coil/radio-frequency antenna system as claimed in claim 4 comprising a capacitor disposed at said edge region of said gradient coil unit forming a radio-frequency connection between said return-current conductor and said surrounding conductor.

6. A gradient coil/radio-frequency antenna system as claimed in claim 4 wherein said return-current conductor comprises a portion thereof substantially parallel to said surrounding conductor, and wherein said gradient coil/radio-frequency antenna unit comprises a radio-frequency field chamber disposed between said return current conductor and said surrounding conductor.

7. A gradient coil/radio-frequency antenna system as claimed in claim 6 comprising sealing compound at least partially filling said radio-frequency field chamber.

8. A gradient coil/radio-frequency antenna system as claimed in claim 4 comprising a further electrically-conductive connection between said return current conductor and said surrounding conductor, disposed at a symmetry point between said return current conductor and said surrounding conductor.

9. A gradient coil/radio-frequency antenna system as claimed in claim 8 wherein said further electrically-conductive connection has a tube-shape adapted to accept current supply lines and cooling lines for said gradient coil unit.

10. A gradient coil/radio-frequency antenna system as claimed in claim 4 comprising a further electrically-conductive connection between said return current conductor and said surrounding conductor, disposed at a location of substantially equal potential between said return current conductor and said surrounding conductor.

11. A gradient coil/radio-frequency antenna system as claimed in claim 10 wherein said further electrically-conductive connection has a tube-shape adapted to accept current supply lines and cooling lines for said gradient coil unit.

12. A gradient coil/radio-frequency antenna system as claimed in claim 4 wherein said gradient coil unit comprises two primary surfaces, at least one of which is a planar surface, and an edge surface therebetween, and wherein said return current conductor comprises a portion thereof disposed in the plane of the planar primary surface, separated from said edge surface, with a radio-frequency electrical connection to said portion of said return conductor being produced by said surrounding conductor.

13. A gradient coil/radio-frequency antenna system as claimed in claim 12 wherein said surrounding conductor forms a radio-frequency shield for said gradient coil unit.

14. A gradient coil/radio-frequency antenna system as claimed in claim 1 wherein said gradient coil unit is a first gradient coil unit, and comprising a second gradient coil unit disposed relative to said first gradient coil unit for producing a shielding of said gradient magnetic field outside of said examination region.

15. A gradient coil/radio-frequency antenna system as claimed in claim 14 wherein said radio-frequency antenna conductor surrounding said first gradient coil unit and between said gradient coil unit and said examination volume is a surrounding conductor, and wherein said radio-frequency antenna in each gradient coil/radio-frequency unit comprises a return current conductor having a radio-frequency electrical connection to said surrounding conductor, and wherein said return current conductor forms a radio-frequency shield for said second gradient coil unit.

16. A gradient coil/radio-frequency system as claimed in claim 1 wherein said radio-frequency antenna conductor surrounding said gradient coil unit comprises multiple layers for eddy current suppression.

17. A gradient coil/radio-frequency system as claimed in claim 1 wherein said radio-frequency antenna conductor surrounding said gradient coil unit comprises slots for eddy current suppression.

18. A gradient coil/radio-frequency antenna system as claimed in claim 1 wherein said radio-frequency antenna conductor surrounding said gradient coil unit and between said gradient coil unit and said examination volume is a surrounding conductor, and wherein said radio-frequency antenna in each gradient coil/radio-frequency unit comprises a return-current conductor with a radio-frequency electrical connection to said surrounding conductor, and wherein at least one of said surrounding conductor and said return-current conductor comprises multiple layers for eddy current suppression.

19. A gradient coil/radio-frequency antenna system as claimed in claim 1 wherein said radio-frequency antenna conductor surrounding said gradient coil unit and between said gradient coil unit and said examination volume is a surrounding conductor, and wherein said radio-frequency antenna in each gradient coil/radio-frequency unit comprises a return-current conductor with a radio-frequency electrical connection to said surrounding conductor, and wherein at least one of said surrounding conductor and said return-current conductor comprises slots for eddy current suppression.

20. An open magnetic resonance apparatus comprising:
an open basic field magnet having spaced apart pole plates that generate a basic magnetic field in an open examination volume therebetween; and
two gradient coil/radio-frequency antenna units respectively attached to said pole plates, each comprising a radio-frequency antenna comprising a radio-frequency antenna conductor, said radio-frequency antenna generating a radio-frequency field in said examination volume, and a gradient coil unit for generating a gradient magnetic field in said examination volume, said radio-frequency antenna conductor in each gradient coil/radio-frequency unit surrounding said gradient coil unit therein, with said radio-frequency antenna conductor between said gradient coil unit and said examination volume.

21. A magnetic resonance apparatus as claimed in claim 20 wherein said radio-frequency antenna conductor that surrounds said gradient coil unit and is between said gradient coil unit and said examination volume is a surrounding conductor, and wherein said radio-frequency antenna in each gradient coil radio-frequency antenna unit additionally comprises a return-current conductor in radio-frequency electrical connection with said surrounding conductor at an edge region of said gradient coil unit.

* * * * *